(12) United States Patent
Prikhodko et al.

(10) Patent No.: US 8,175,523 B2
(45) Date of Patent: *May 8, 2012

(54) COMPACT LOW LOSS HIGH FREQUENCY SWITCH WITH IMPROVED LINEARITY PERFORMANCE

(75) Inventors: Dima Prikhodko, Woburn, MA (US); Jerod F. Mason, Bedford, MA (US); Steven P. Matte, Jamestown, NC (US); John Pessia, Medford, MA (US); Jason Chiesa, Tyngsboro, MA (US); Sergey Nabokin, Woburn, MA (US); Gene A. Tkachenko, Belmont, MA (US); Richard A. Carter, Canida, NH (US); Steven C. Sprinkle, Hampstead, NH (US); Mikhail Shirokov, Methuen, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/980,759

(22) Filed: Dec. 29, 2010

(65) Prior Publication Data
US 2011/0151776 A1   Jun. 23, 2011

Related U.S. Application Data

(63) Continuation of application No. 11/935,690, filed on Nov. 6, 2007, now Pat. No. 7,877,058.

(60) Provisional application No. 60/858,228, filed on Nov. 10, 2006.

(51) Int. Cl.
*H04B 7/185* (2006.01)

(52) U.S. Cl. .............. 455/13.3; 455/63.3; 455/63.1; 455/501; 333/103

(58) Field of Classification Search .......... 455/13.3, 455/63.3, 63.1, 501, 78, 83, 25, 562.1; 333/103; 327/308
See application file for complete search history.

(56) References Cited

U.S. PATENT DOCUMENTS

| | | | | |
|---|---|---|---|---|
| 3,725,748 | A * | 4/1973 | Atkins | 361/181 |
| 5,001,668 | A * | 3/1991 | Ito et al. | 365/185.25 |
| 5,347,601 | A * | 9/1994 | Ade et al. | 385/3 |
| 5,648,757 | A * | 7/1997 | Vernace et al. | 340/539.32 |
| 5,659,258 | A * | 8/1997 | Tanabe et al. | 326/68 |
| 5,796,286 | A * | 8/1998 | Otaka | 327/308 |
| 6,528,951 | B2 * | 3/2003 | Yamazaki et al. | 315/169.3 |
| 6,618,308 | B2 * | 9/2003 | Blodgett | 365/207 |
| 6,642,578 | B1 | 11/2003 | Arnold et al. | |
| 6,720,850 | B2 * | 4/2004 | Sasabata et al. | 333/261 |
| 6,996,376 | B2 * | 2/2006 | Clifton | 455/78 |
| 7,176,046 | B2 * | 2/2007 | Taylor | 438/47 |
| 7,274,222 | B2 * | 9/2007 | Alacoque et al. | 327/94 |
| 7,335,914 | B2 * | 2/2008 | Shibusawa | 257/59 |
| 7,420,402 | B2 * | 9/2008 | Washio et al. | 327/208 |
| 7,489,777 | B2 * | 2/2009 | Yamazaki et al. | 379/433.07 |

(Continued)

FOREIGN PATENT DOCUMENTS

JP        2005-006143 A        1/2005

(Continued)

*Primary Examiner* — Minh D Dao
(74) *Attorney, Agent, or Firm* — Knobbe, Martens, Olson & Bear, LLP

(57) ABSTRACT

A switch element includes a switch device having a drain, a source and a plurality of gates, and at least one additional interconnect located between the plurality of gates, the additional interconnect operative to establish a constant potential between the at least two gates.

23 Claims, 9 Drawing Sheets

U.S. PATENT DOCUMENTS

| | | | |
|---|---|---|---|
| 7,505,790 B2 * | 3/2009 | Chang et al. | 455/562.1 |
| 7,515,882 B2 * | 4/2009 | Kelcourse et al. | 455/78 |
| 7,719,141 B2 * | 5/2010 | McMorrow | 307/115 |
| 2002/0124385 A1 * | 9/2002 | Tsai et al. | 29/622 |
| 2002/0196098 A1 * | 12/2002 | Sasabata et al. | 333/81 R |
| 2004/0141470 A1 * | 7/2004 | Kelcourse et al. | 370/282 |
| 2006/0138420 A1 * | 6/2006 | Shibusawa | 257/59 |
| 2006/0290692 A1 * | 12/2006 | Kimura et al. | 345/211 |
| 2008/0043384 A1 * | 2/2008 | Chu | 361/23 |
| 2008/0079653 A1 * | 4/2008 | Ahn et al. | 343/904 |
| 2008/0129642 A1 * | 6/2008 | Ahn et al. | 343/876 |
| 2009/0022001 A1 * | 1/2009 | Morishita et al. | 365/207 |
| 2009/0073078 A1 * | 3/2009 | Ahn et al. | 343/876 |
| 2009/0261382 A1 * | 10/2009 | O'Keefe et al. | 257/190 |
| 2010/0109796 A1 * | 5/2010 | Park et al. | 333/103 |

FOREIGN PATENT DOCUMENTS

| | | | |
|---|---|---|---|
| JP | 2005-268895 A | | 9/2005 |
| JP | 2005268895 A | * | 9/2005 |
| JP | 2006-310509 A | | 11/2006 |
| JP | 2006-310510 A | | 11/2006 |
| JP | 2006-310511 A | | 11/2006 |

* cited by examiner

COMPACT LOW LOSS HIGH FREQUENCY SWITCH WITH IMPROVED LINEARITY PERFORMANCE

CROSS REFERENCE TO RELATED APPLICATION

This application is a continuation of co-pending U.S. utility application entitled "COMPACT LOW LOSS HIGH FREQUENCY SWITCH WITH IMPROVED LINEARITY PERFORMANCE," having Ser. No. 11/935,690, filed on Nov. 6, 2007, and which is entirely incorporated herein by reference, which claims priority to U.S. provisional application entitled, "COMPACT LOW LOSS HIGH FREQUENCY SWITCH WITH IMPROVED LINEARITY PERFORMANCE," having Ser. No. 60/858,228, filed on Nov. 10, 2006, and which is entirely incorporated herein by reference.

BACKGROUND

Portable communication devices, such as cellular telephones, typically are required to operate over a number of different communication bands. These so called "multiband" communication devices use one or more instances of transmit and receive circuitry to generate and amplify the transmit and receive signals. However, these communication devices usually employ a single antenna to transmit and receive the signals over the various communication bands.

The antenna in such communication devices is typically connected to the transmit and receive circuitry through switching circuitry, such as a duplexer or a diplexer, or through an isolated switch element, sometimes referred to as a "transmit/receive switch" or an "antenna switch." The switching circuitry or the isolated switch element must effectively isolate the transmit signal from the receive signal. Isolating the transmit signal from the receive signal becomes more problematic in a multiple band communications device where the transmit frequency of one communication band might overlap with the receive frequency of a different communication band.

FIG. 1 is a schematic diagram illustrating a portion of a prior art transceiver 10 showing a blocking signal interfering with a received signal. The transceiver 10 includes an antenna 12 coupled via connection 14 to an antenna switch 16. The antenna switch 16 is coupled via connection 17 to a phase shifter 18. The phase shifter 18 is coupled via bi-directional connection 19 to a transmit filter 21 and to a receive filter 22. The antenna switch 16, a phase shifter 18, transmit filter 21, and receive filter 22 form a duplexer. The transmit filter 21 receives an amplified output of a power amplifier 25 via connection 24. The receive filter 22 delivers the receive signal via connection 27 to a low noise amplifier 28. The remainder of the transmit circuitry, the remainder of the receive circuitry and the baseband processing elements are omitted from FIG. 1 for simplicity.

The antenna switch 16 isolates the transmit signal from the receive signal. When implementing a 2G or 3G transceiver, linearity and physical size of the antenna switch are significant design factors. Linearity is usually defined by what is referred to as a third order intermodulation product, referred to as IMD3. As shown in FIG. 1, the nature of this effect is that mixing products of the TX signal with an outside blocker signal fall into the RX band, as shown using the graphical illustration 41 and specifically, the vector 46. The IMD signal may deteriorate the sensitivity of the receiver if the antenna switch 18 allows a sufficiently high IMD signal.

The largest factor in IMD performance of the antenna switch 18 is the nonlinear capacitance of the off branches of the switch. As shown in FIG. 2, the antenna switch 18 comprises a number of branches 22, 24, 26 and 28, with the number of branches dependent upon the number of frequency bands implemented in the transceiver. In this example the branches 24, 26 and 28 are "off" and the branch 22 is "on". In this example, the branches 22, 24, 26 and 28 are implemented using field effect transistors (FETS) and the gate, source and drain connections are shown in FIG. 2. The parasitic capacitances of the off branches 24, 26 and 28 becomes more linear at more negative Vgs(Vds) voltages. This is one reason that conventional 2G/3G solutions are implemented using charge pumps. FIGS. 3A and 3B show a typical source/gate/drain layout for the schematic diagram of FIG. 2. The drain and source ohmic contacts on conventional devices occupy large areas increasing both die size and parasitic capacitances. FIG. 3A shows a typical interconnection of three single gate FET devices 32, 34 and 36 having an area on the order of 120× 547=65640 $\mu m^2$. FIG. 3B is a schematic diagram of the layout of FIG. 3A. The resistance Rlin is a resistance between the drain and source of each FET device.

Therefore, it would be desirable to have an antenna switch that provides high linearity and low loss in a small area.

SUMMARY

Embodiments of the invention include a switch element, including a switch device having a drain, a source and a plurality of gates, and at least one additional interconnect located between the plurality of gates, the additional interconnect operative to establish a constant potential between the at least two gates.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the compact low loss high frequency switch with improved linearity performance (also referred to herein as the "compact low loss switch") can be implemented in any transceiver device where the combination of a transmit signal and a blocking signal may overlap a receive band and in which the combined signal may impair receiver performance.

The compact low loss switch is generally implemented in hardware. However, one or more of the signals that control the compact low loss switch can be implemented in software, or a combination of hardware and software. When implemented in hardware, the compact low loss switch can be implemented using specialized hardware elements. When one or more of the control signals for the compact low loss switch are generated at least partially in software, the software portion can be used to precisely control the operating aspects of various components in compact low loss switch. The software can be stored in a memory and executed by a suitable instruction execution system (microprocessor). The hardware implementation of the compact low loss switch can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), a separate, specially designed integrated circuit for biasing purposes, etc.

The software for the compact low loss switch comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Figure 1:
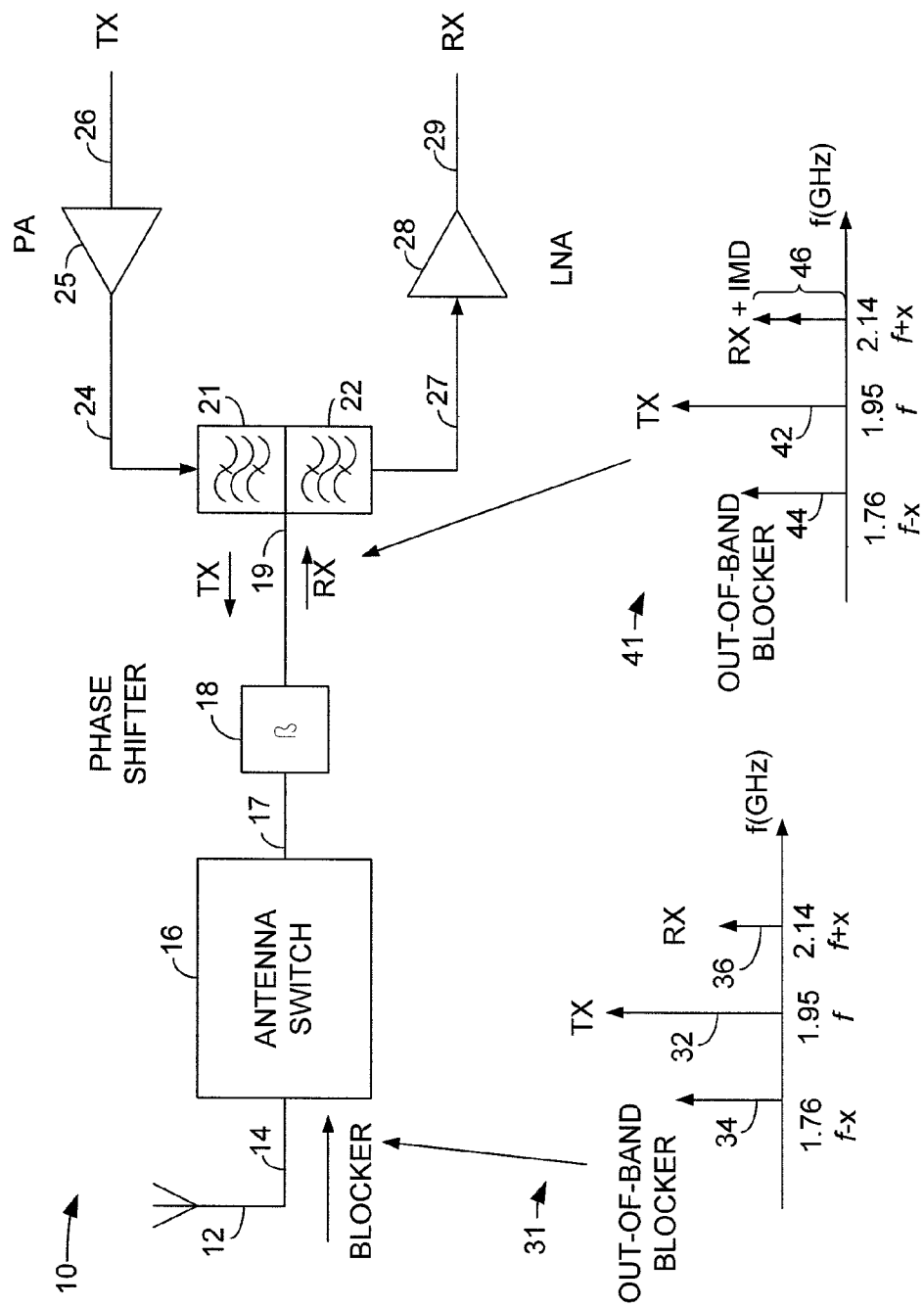
FIG. 1 is a schematic diagram illustrating a portion of a prior art transceiver showing a blocking signal interfering with a received signal.
Figure 2:
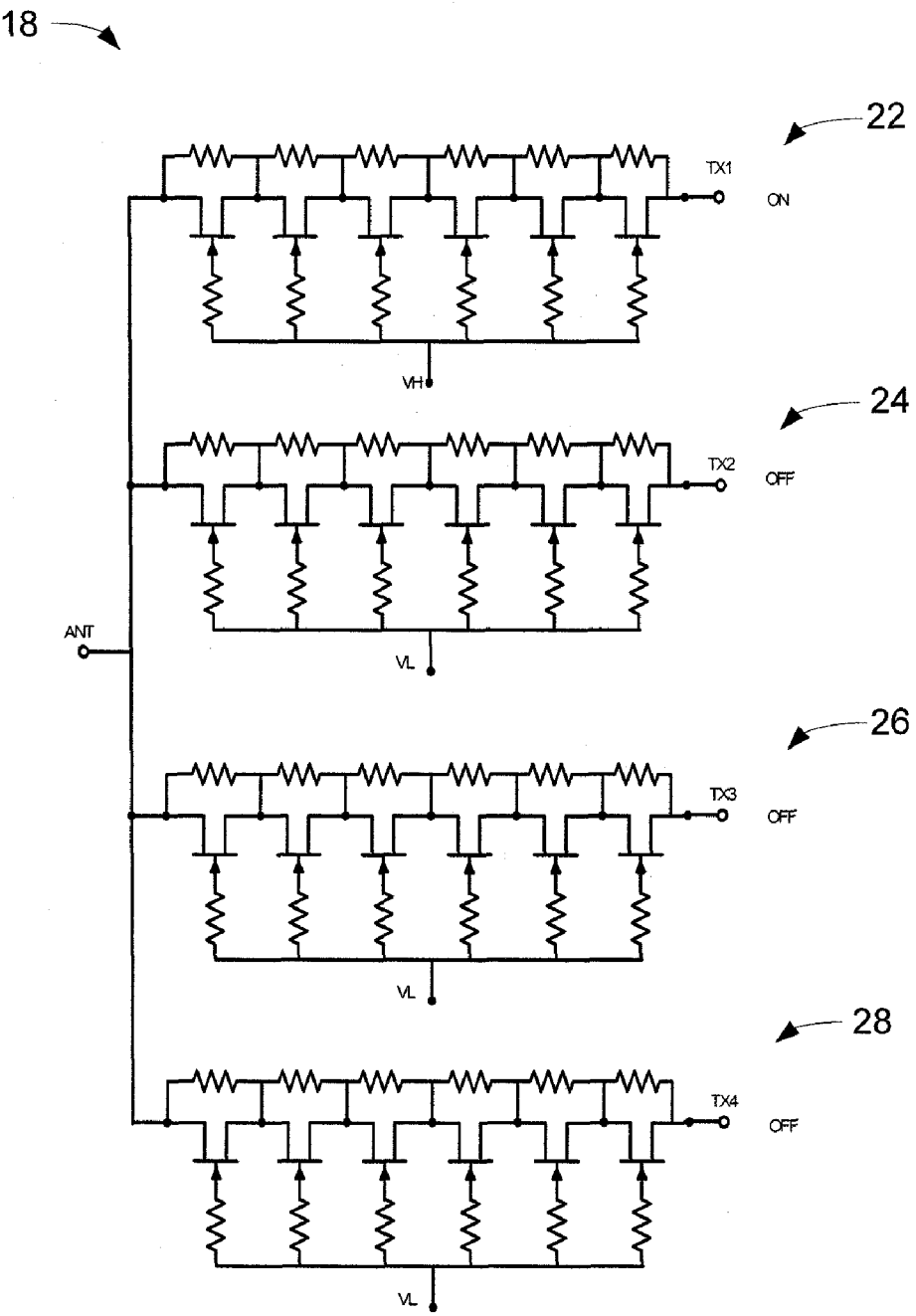
FIG. 2 is a schematic diagram illustrating a prior art antenna switch.
Figure 3A:
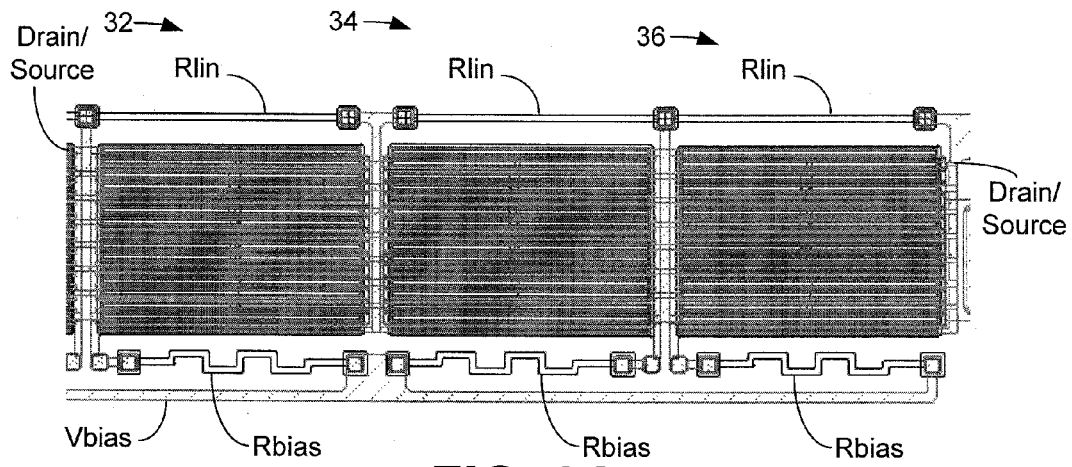
FIG. 3A is a layout diagram of a prior art antenna switch.
Figure 3B:
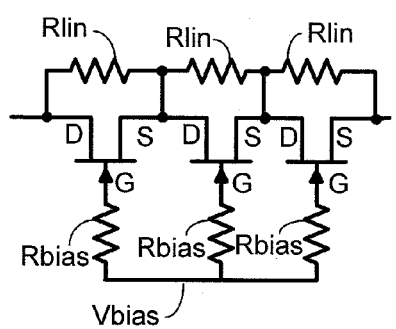
FIG. 3B is a schematic diagram illustrating a portion of the antenna switch of FIG. 3A.
Figure 4:
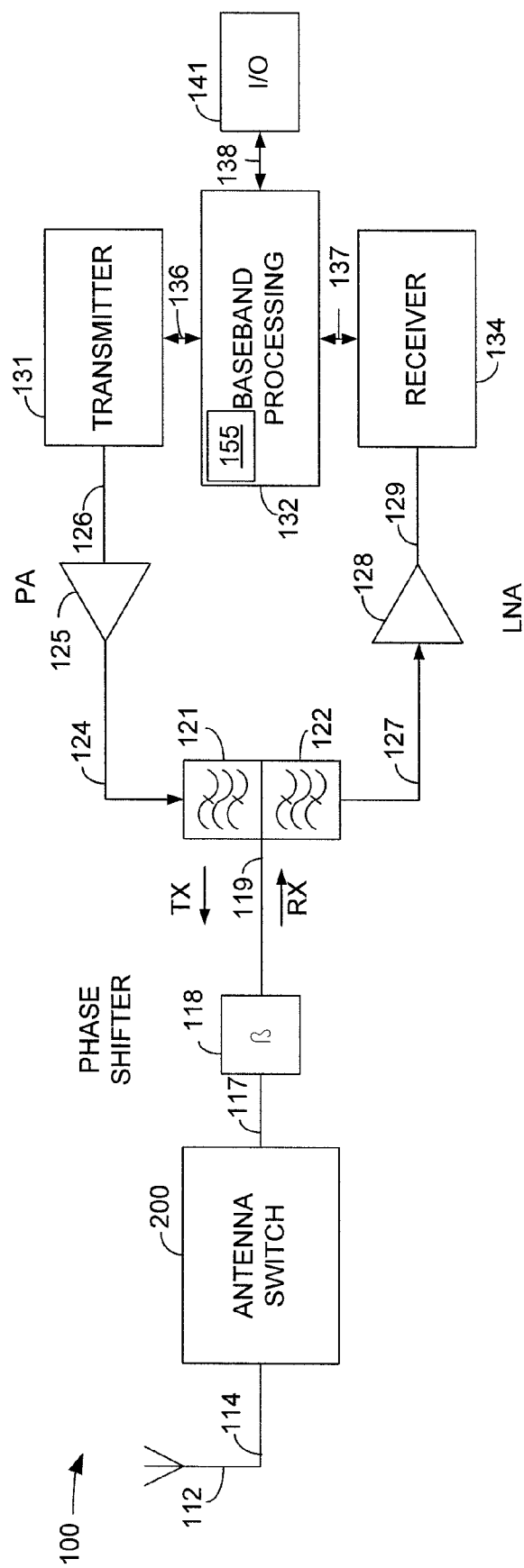
FIG. 4 is a schematic diagram illustrating a portion of a transceiver including an embodiment of a compact low loss switch.

FIG. 4 is a schematic diagram illustrating a portion of a transceiver 100 including an embodiment of a compact low loss switch 200. The transceiver 100 includes an antenna 112 coupled via connection 114 to a compact low loss antenna switch 200. The compact low loss antenna switch 200 is coupled via connection 117 to a phase shift element 118. The phase shift element 118 is coupled via bi-directional connection 119 to a transmit filter 121 and to a receive filter 122. The transmit filter 121 receives an amplified output of a power amplifier 125 via connection 124. A transmitter 131 supplies the transmit signal via connection 126 to the power amplifier 125.

The receive filter 122 delivers the receive signal via connection 127 to a low noise amplifier 128. The output of the low noise amplifier 128 is supplied via connection 129 to a receiver 134. The transmitter 131 and the receiver 134 are shown for illustrative purposes only. Various configurations and implementation of a transmitter and receiver are known to those having ordinary skill in the art and all such implementations are contemplated herein. The transceiver 100 also comprises baseband processing circuitry 132 coupled to the transmitter 131 via connection 136 and coupled to the receiver 134 via connection 137. The baseband processing circuitry performs baseband signal processing for the transmit signal and for the receive signal as known in the art. If one or more portions or aspects of the compact low loss switch 200 are implemented in software, then the baseband processing circuitry includes the compact low loss switch software 155.

The baseband processing circuitry 132 is coupled to an input/output element 141 via connection 138. In an example in which the transceiver 100 is part of a portable communications device, such as a cellular-type telephone, the input/output element 141 comprises a microphone, speaker, keyboard, pointing device, or other interface elements.

Figure 5A:
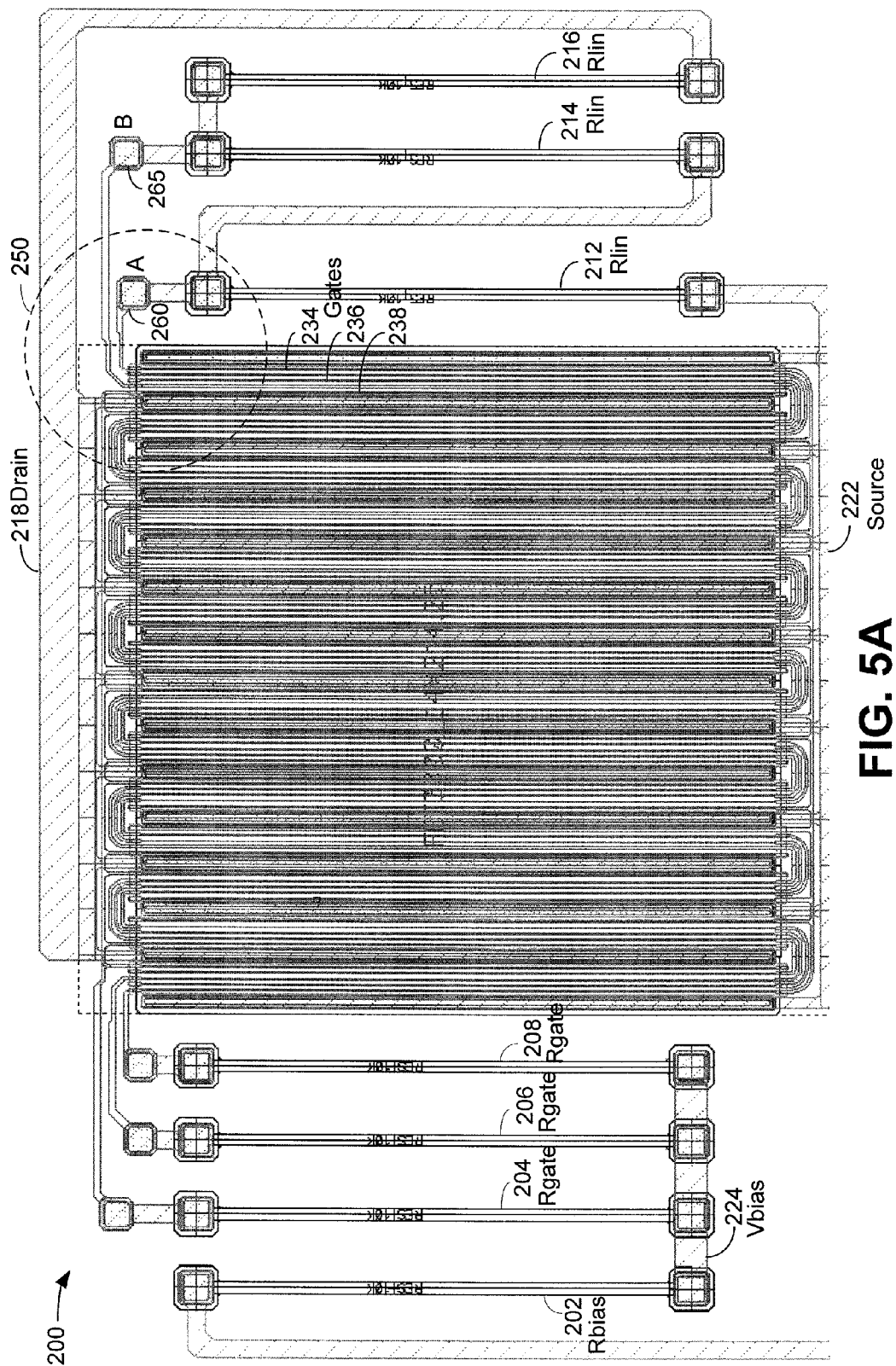
FIG. 5A is a layout diagram of a three gate FET device suitable for use in the compact low loss switch of FIG. 4.
Figure 5B:
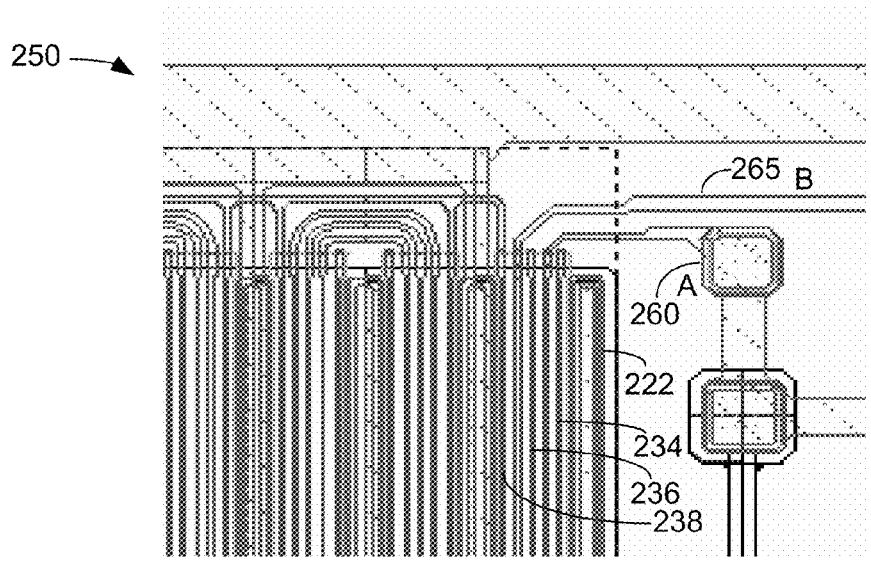
FIG. 5B is a layout diagram showing in greater detail a portion of the device of FIG. 5A.
Figure 6A:
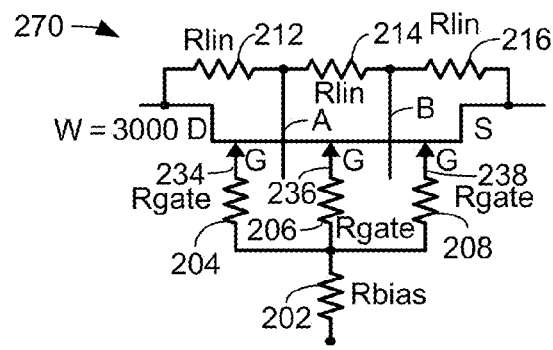
FIG. 6A is a schematic diagram illustrating an embodiment of a three gate device of FIG. 5A and FIG. 5B when implemented using an ohmic contact.
Figure 6B:
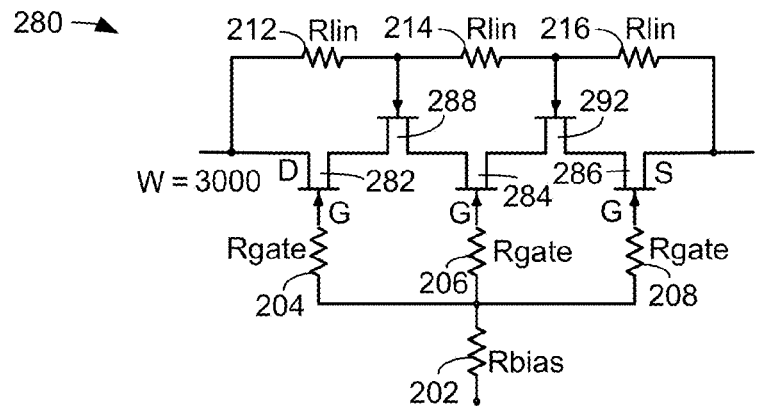
FIG. 6B is a schematic diagram illustrating an embodiment of a three gate device of FIG. 5A and FIG. 5B when implemented using a Schottky contact.

An exemplary layout of a compact low loss switch having a three gate structure is shown diagrammatically in FIGS. 5A and 5B, and is shown schematically in FIGS. 6A and 6B.

FIG. 5A is a layout diagram of a three gate FET device 200 suitable for use in the compact low loss switch 200 of FIG. 4. The device 200 comprises a drain 218 and a source 222. A bias voltage 224 is applied through a bias resistance 202. In this embodiment, three gates 234, 236 and 238 are associated with three gate resistances 204, 206 and 208, respectively. Linear resistances 212, 214 and 216 are associated with the gate resistances 204, 206 and 208, respectively. In an embodiment, an additional interconnect "A" 260 is created between the gates 234 and 236, and an additional interconnect "B" 265 is created between the gates 236 and 238 of this multi-gate device. The interconnects A 260 and B 265 form nodes that establish a constant potential between adjacent gates 234, 236 and 238, thus eliminating the 'floating' node nature of gates on a conventional multi-gate device. Additional multigate devices are produced by putting more "node gates" in the X dimension or by stacking these devices in Y dimension. FIG. 5A shows the interconnection of a three gate FET device having an area on the order of $220 \times 240 = 52800$ $\mu m^2$.

FIG. 5B is a layout diagram showing in greater detail a portion of the device of FIG. 5A. The area 250 shows the gates 234, 236 and 238 having the additional interconnects A 260 and B 265 located interleaved with respect to the gates 234, 236 and 238. In an embodiment, the thickness of the traces that form the gates 234, 236 and 238, and the additional interconnects A 260 and B 265 are on the order of 0.5 μm. In this example, the additional interconnects A 260 and B 265 form two additional gates for a FET device. In an embodiment, the spacing between the gates 234, 236 and 238 is approximately 1.2 micrometers (μm), subject to manufacturing tolerances. However, the spacing between the gates can be smaller as processing technology improves. The connections that form the gates 234, 236 and 238 form Schottky diode connections, which are smaller than corresponding ohmic connections, associated with the drain/source connections of adjacent devices.

FIG. 6A is a schematic diagram illustrating an embodiment of a three gate device 200 of FIG. 5A and FIG. 5B when implemented using an ohmic contact. An ohmic contact is a region on a semiconductor device that has been prepared so that the current-voltage (I-V) curve of the device is linear and symmetric. The device 270 comprises a bias resistance 202, gate resistances 204, 206 and 208, and gates 234, 236 and 238. Additional interconnect A is illustrated between the gates 234 and 236 and additional interconnect B is illustrated between the gates 236 and 238.

FIG. 6B is a schematic diagram illustrating an embodiment of a three gate device 200 of FIG. 5A and FIG. 5B when implemented using a Schottky contact. A Schottky contact is a region on a semiconductor device that has been prepared so that the current-voltage (I-V) curve of the device is non-linear and asymmetric. The device 280 comprises a bias resistance 202, gate resistances 204, 206 and 208, and FET devices 282, 284 and 286. Additional interconnect A 260 is illustrated as the FET device 288 between the gates 282 and 284 and additional interconnect B is illustrated as the FET device 292 between the gates 284 and 286.

In accordance with an embodiment, multigate devices are formed with the gate connections formed as Schottky contacts to contact the resistance Rlin associated with each device. This reduces the gate to gate pitch when compared to drain/source ohmic contacts, and thus the physical size of the gate connections is significantly reduced when compared to ohmic contacts.

In the example shown in FIG. 6A and 6B, a triple gate device having the benefit of occupying a small amount of area and having the two additional interconnects a and B forming additional gates 260 and 265, respectively, to eliminate the 'floating' node nature of gates on a conventional multi-gate device is fabricated from the five gates shown in FIG. 6A and 6B.

Another aspect of the invention is that three-gate structures are used as a starting point to make additional multi-gate devices. For example, using the above-described three-gate devices, other devices having additional gates can be formed by connecting the internal gates of such devices to the resistance Rlin to realize source-gate, drain-gate and triple-gate structures.

Figure 7A:
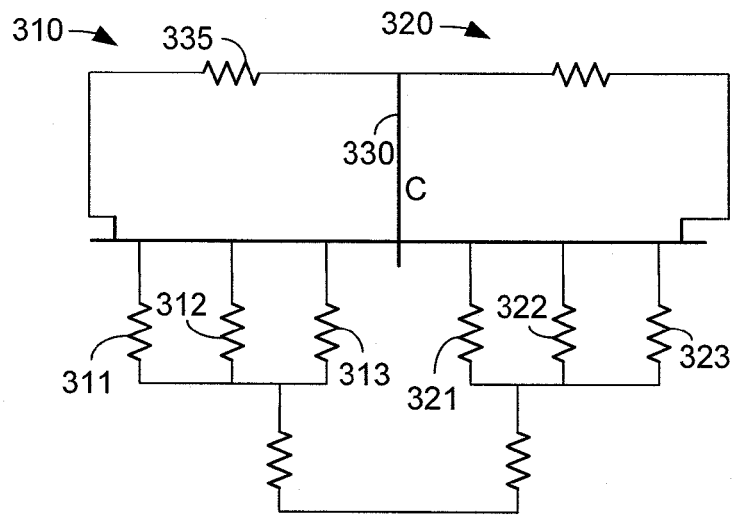
FIG. 7A is a schematic diagram illustrating two three-gate devices formed from a seven gate structure.

FIG. 7A is a schematic diagram illustrating two three-gate devices formed from a seven gate structure. The three gate device 310 includes gates 311, 312 and 313. The three gate device 320 includes gates 321, 322 and 323. An additional interconnect C 330 is formed between the gates 313 and 321 in contact with Rlin 335, thus realizing two three-gate devices with only one gate connected to Rlin 335.

Figure 7B:
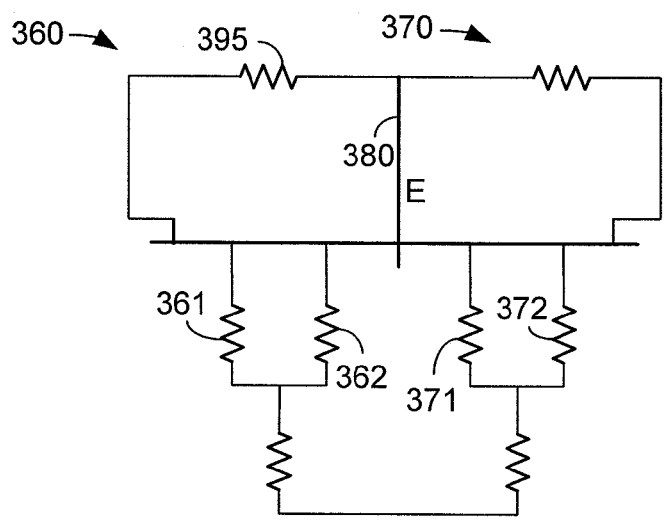
FIG. 7B is a schematic diagram illustrating two two-gate devices formed from a five gate structure.

FIG. 7B is a schematic diagram illustrating two two-gate devices formed from a five gate structure. The two gate device 360 includes gates 361 and 362. The two gate device 370 further includes gates 371 and 372. An additional interconnect E 380 is formed between the gates 362 and 3371 in contact with Rlin 395, thus realizing two two-gate devices with only one gate connected to Rlin 395.

The structures of FIGS. 7A and 7B are possible because of the use of the interleaved connection of the gates described herein. At least one gate should be connected to Rlin and the maximum number of gates that can be connected to Rlin is the total number of gates/2−1.

Figure 8:
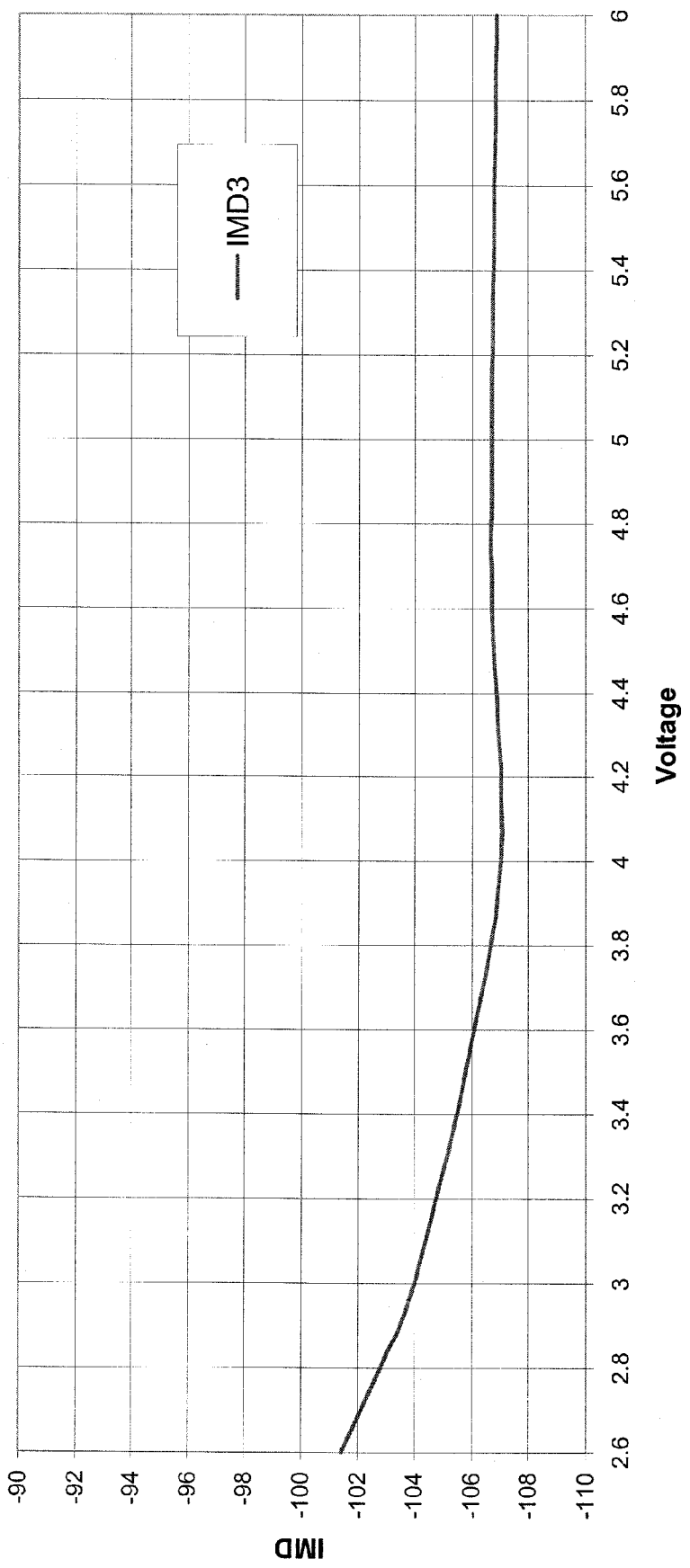
FIG. 8 is a graphical illustration showing the improvement in IMD3 performance of a four-branch antenna switch using the structure described above for the switch elements.

FIG. 8 is a graphical illustration 400 showing the improvement in IMD3 performance of a four-branch antenna switch using the structure described above for the switch elements. The horizontal axis represents phase and the vertical axis represents IMD3 in dBm.

Figure 9:
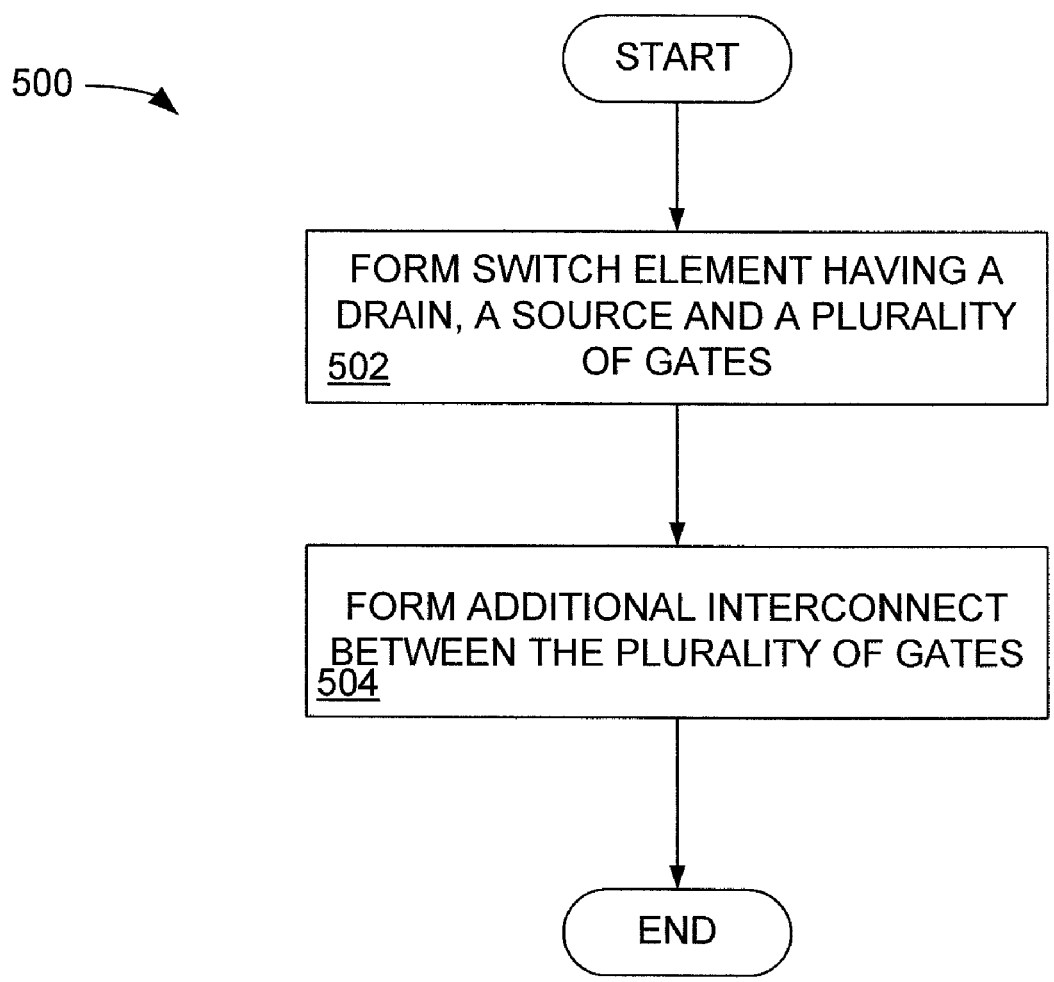
FIG. 9 is a flow chart illustrating an example of making an embodiment of a compact low loss switch.

FIG. 9 is a flow chart 500 illustrating an example of making an embodiment of a compact low loss switch. The blocks in the flow chart 500 can be performed in or out of the order shown and are meant to be illustrative only. In block 502, a switch device is formed having a drain, a source and a plurality of gates. Those skilled in the art of semiconductor device processing will understand that such element may be formed using a variety of processing methodologies. In block 504, at least one additional interconnect is formed between the plurality of gates. The additional interconnect is operative to establish a constant potential between the plurality of gates. In an embodiment, a plurality of additional interconnects are interleaved with a plurality of gates.

All like metal layers are fabricated during the same step. All ohmic contacts are fabricated at the same mask level, and all Schottky gate contacts are fabricated during the same masking process. Further, the steps in blocks 502 and 504 can be integrated so that they are made concurrently in the same series of manufacturing operations.

While various embodiments of the invention have been described, it will be apparent to those of ordinary skill in the art that many more embodiments and implementations are possible that are within the scope of this invention.

What is claimed is:

1. A switch element, comprising:
   a switch device having a drain, a source and a plurality of gates located between the drain and the source; and
   at least one additional interconnect located among the plurality of gates, the additional interconnect implemented to establish a substantially constant potential between the plurality of gates.

2. The switch element of claim 1 wherein the switch element includes at least three gates and at least two additional interconnects interleaved with the at least three gates.

3. The switch element of claim 1 wherein the plurality of gates are configured as ohmic contacts.

4. The switch element of claim 1 wherein the plurality of gates are configured as Schottky contacts.

5. The switch element of claim 1 wherein a pair of switch devices are coupled together.

6. The switch element of claim 1 wherein the at least one additional interconnect has a line width of approximately 0.5 μm.

7. The switch element of claim 1 wherein the at least one additional interconnect has a line width of approximately 0.5 μm and each of the plurality of gates has a line width of approximately 0.5 μm.

8. A portable transceiver, comprising:
   an antenna;
   a transmitter and a receiver, each operatively coupled to the antenna; and
   switch element operatively coupled to the transmitter and to the receiver, the switch element including a switch device having a drain, a source and a plurality of gates located between the drain and the source; and at least one additional interconnect located among the plurality of gates, the additional interconnect implemented to establish a substantially constant potential between the plurality of gates.

9. The transceiver of claim 8 wherein the switch element includes at least three gates and at least two additional interconnects interleaved with the at least three gates.

10. The transceiver of claim 8 wherein the plurality of gates are configured as ohmic contacts.

11. The transceiver of claim 8 wherein the plurality of gates are configured as Schottky contacts.

12. The transceiver of claim 8 wherein a pair of switch devices are coupled together.

13. The transceiver of claim 8 wherein the at least one additional interconnect has a line width of approximately 0.5 μm.

14. The transceiver of claim 8 wherein the at least one additional interconnect has a line width of approximately 0.5 μm and in which each of the plurality of gates has a line width of approximately 0.5 μm.

15. A switch element, comprising:
a source;
a drain;
a plurality of gates disposed between the source and the drain; and
at least one interconnect disposed adjacent to at least one of the gates so as to reduce or substantially eliminate a floating node effect on the gates.

16. The switch element of claim 15 wherein each of the gates and the at least one interconnect is implemented as a trace.

17. The switch element of claim 16 wherein the gate traces and the at least one interconnect trace extend in a substantially parallel manner.

18. The switch element of claim 15 wherein the at least one interconnect is connected to resistance Rlin between the source and the drain.

19. The switch element of claim 15 wherein the switch element includes N gates and N−1 interconnects arranged in an interleaved manner.

20. The switch element of claim 15 wherein the gates and the at least one interconnect are implemented as ohmic contacts.

21. The switch element of claim 15 wherein the gates and the at least one interconnect are implemented as Schottky contacts.

22. The switch element of claim 15 wherein the gates are grouped into two or more groups such that the at least one interconnect is located between two neighboring groups.

23. A switch element, comprising:
a source;
a drain;
a plurality of gate structures disposed between the source and the drain, at least one of the gate structures connected to resistance Rlin between the source and the drain so as to reduce or substantially eliminate a floating node effect on the gate structures.

* * * * *